United States Patent
Enebakk et al.

(10) Patent No.: US 7,381,392 B2
(45) Date of Patent: Jun. 3, 2008

(54) SILICON FEEDSTOCK FOR SOLAR CELLS

(75) Inventors: Erik Enebakk, Kristiansand (NO);
Kenneth Friestad, Kristiansand (NO);
Ragnar Tronstad, Sogne (NO); Cyrus Zahedi, Sandvika (NO); Christian Dethloff, Oslo (NO)

(73) Assignee: Elkem AS (NO)

( * ) Notice: Subject to any disclaimer, the term of this patent is extended or adjusted under 35 U.S.C. 154(b) by 79 days.

(21) Appl. No.: 10/585,004

(22) PCT Filed: Jan. 12, 2004

(86) PCT No.: PCT/NO2004/000003

§ 371 (c)(1),
(2), (4) Date: Jun. 28, 2006

(87) PCT Pub. No.: WO2005/063621

PCT Pub. Date: Jul. 14, 2005

(65) Prior Publication Data

US 2007/0128099 A1   Jun. 7, 2007

(30) Foreign Application Priority Data

Dec. 29, 2003   (NO) .................................. 20035830

(51) Int. Cl.
*C01B 33/26* (2006.01)
(52) U.S. Cl. .................. 423/328.2; 117/13; 117/18
(58) Field of Classification Search ............ 117/13, 117/18; 118/18; 423/328.2
See application file for complete search history.

(56) References Cited

U.S. PATENT DOCUMENTS 4,247,528 A * 1/1981 Dosaj et al. ................. 117/11

(Continued)

FOREIGN PATENT DOCUMENTS

EP   1338682 A   8/2003

(Continued)

OTHER PUBLICATIONS

Analysis of the silicon market: Will thin films profit?, Brandsen, G.W., et al, Energy Policy: Publisher: kidlington, (2007) ☐☐vol. 35, No. 6, pp. 1-8.*

(Continued)

*Primary Examiner*—Felisa C Hiteshew
(74) *Attorney, Agent, or Firm*—Lucas & Mercanti, LLP

(57) ABSTRACT

The present invention relates to silicon feedstock for producing directionally solidified silicon ingots, thin sheets and ribbons for the production of silicon wafers for PV solar cells where the silicon feedstock contains between 0.2 and 10 ppma boron and between 0.1 and 10 ppma phosphorus distributed in the material. The invention further relates to directionally solidified silicon ingot or thin silicon sheet or ribbon for making wafers for solar cells containing between 0.2 ppma and 10 ppma boron and between 0.1 ppma and 10 ppma phosphorus distributed in the ingot, said silicon ingot having a type change from p-type to n-type or from n-type to p-type at a position between 40 and 99% of the ingot height or sheet or ribbon thickness and having a resistivity profile described by an exponential curve having a starting value between 0.4 and 10 ohm cm and where the resistivity value increases towards the type change point. Finally the invention relates to a method for producing silicon feedstock for producing directionally solidified silicon ingots, thin sheets and ribbons for the production of silicon wafers for PV solar cells.

5 Claims, 1 Drawing Sheet

U.S. PATENT DOCUMENTS

Figure 1:
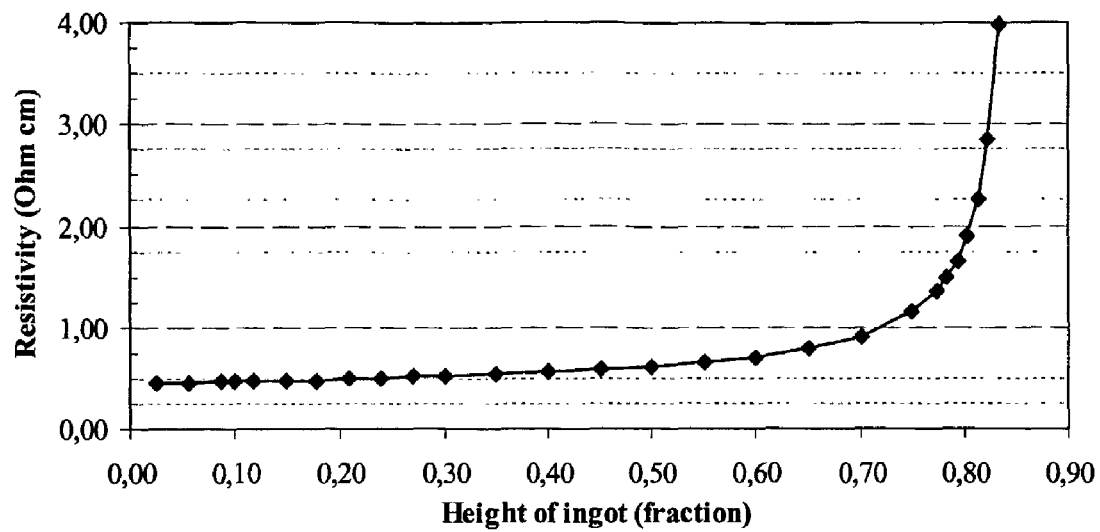

| | | |
|---|---|---|
| 5,972,107 A | 10/1999 | Schmid et al. |
| 2001/0020438 A1 | 9/2001 | Hoshikawa et al. |

FOREIGN PATENT DOCUMENTS

| | | |
|---|---|---|
| WO | 02099166 A | 12/2002 |

OTHER PUBLICATIONS

Ciszek T. F. et al., "Alternative Solar-Grade Silicon Feedstock Approaches" NREL Conference Paper, The NCPV Program Review Meeting, Lakewood, Colorado, Oct. 14-17, 2001.

Australian Research Council, University of New South Wales, "Third Generation Photovoltaics 2002 Annual Report".

Tsou Y.S. et al., "Environmentally Benign Silicon Cell Manufacturing", World Conference and Exhibition on Photovoltaic Solar Energy Conversion, Jul. 6-10, 1998, Vienna Austria.

von Keitz A. et al., "Improvement of Low Cost Ceramic Substrates for Use in Thin Film Silicon Solar Cells", World Conference and Exhibition on Photovoltaic Solar Energy Conversion, Jul. 6-10, 1998, Vienna Austria.

\* cited by examiner

SILICON FEEDSTOCK FOR SOLAR CELLS

TECHNICAL FIELD

The present invention relates to silicon feedstock for wafers for solar cells, wafers for solar cells, solar cells and a method for the production of silicon feedstock for the production of wafers for solar cells.

BACKGROUND TECHNOLOGY

In recent years, photovoltaic solar cells have been produced from ultra pure virgin electronic grade polysilicon (EG-Si) supplemented by suitable scraps, cuttings and rejects from the electronic chip industry. As a result of the recent downturn experienced by the electronics industry, idle polysilicon production capacity has been adapted to make available lower cost grades suitable for manufacturing PV solar cells. This has brought a temporary relief to an otherwise strained market for solar grade silicon feedstock (SoG-Si) qualities. With demand for electronic devices returning to normal levels, a major share of the polysilicon production capacity is expected to be allocated back to supply the electronics industry, leaving the PV industry short of supply. The lack of a dedicated, low cost source of SoG-Si and the resulting supply gap developing is today considered one of the most serious barriers to further growth of the PV industry.

In recent years, several attempts have been made to develop new sources for SoG-Si that are independent of the electronics industry value chain. Efforts encompass the introduction of new technology to the current polysilicon process routes to significantly reduce cost as well as the development of metallurgical refining processes purifying abundantly available metallurgical grade silicon (MG-Si) to the necessary degree of purity. None have so far succeeded in significantly reducing cost of production while providing a silicon feedstock purity expected to be required to match the performance of PV solar cells produced from conventional silicon feedstock qualities today.

When producing PV solar cells, a charge of SoG-Si feedstock is prepared, melted and directionally solidified into a square ingot in a specialised casting furnace. Before melting, the charge containing SoG-Si feedstock is doped with either boron or phosphorus to produce p-type or n-type ingots respectively. With few exceptions, commercial solar cells produced today are based on p-type silicon ingot material. The addition of the single dopant (eg. boron or phosphorus) is controlled to obtain a preferred electrical resistivity in the material, for example in the range between 0.5-1.5 ohm cm. This corresponds to an addition of 0.02-0.2 ppma of boron when a p-type ingot is desired and an intrinsic quality (practically pure silicon with negligible content of dopants) SoG-Si feedstock is used. The doping procedure assumes that the content of the other dopant (in this example case phosphorus) is negligible (P<1/10 B).

If a single doped SoG-Si feedstock of a given resistivity is used in various addition levels the charge, the addition of dopant is adjusted to take into account the amount of dopant already contained in the pre-doped feedstock material.

Singel doped feedstock qualities of n- and p-type can also be mixed in the charge to obtain a so-called "compensated" ingot. The type and resistivity of each component of the charge mix must be known to obtain desired ingot properties.

After casting, the solidified ingot is cut into blocks with the footprint of the resulting solar cells for example with a surface area of 125 mm×125 mm). The blocks are sliced into wafers deploying commercial multi-wire saw equipment.

PV solar cells are produced from the wafers in a number of process steps of which the most important are surface etching, $POCl_3$ emitter diffusion, PECVD SiN deposition, edge isolation and the formation of front and back contacts.

DESCRIPTION OF INVENTION

By the present invention it has now been found that PV solar cells meeting commercial efficiency targets can be produced from a SoG-Si feedstock produced from metallurgical grade silicon by means of metallurgical refining processes specifically designed for the PV solar feedstock application.

Thus according to a first aspect, the present invention relates to silicon feedstock for producing directionally solidified Czochralski, float zone or multicrystalline silicon ingots, thin silicon sheets or ribbons for the production of silicon wafers for PV solar cells, where the silicon feedstock is characterised in that it contains between 0.2 and 10 ppma boron and between 0.1 and 10 ppma phosphorus distributed in the material.

According to a preferred embodiment the silicon feedstock contains between 0.3 and 5.0 ppma boron and between 0.5 and 3.5 ppma phosphorus.

According to another preferred embodiment, the silicon feedstock (SoG-Si) comprises less than 150 ppma of metallic elements and preferably less than 50 ppma metallic elements.

According to yet a preferred embodiment the silicon feedstock contains less than 150 ppma carbon and more preferably less than 100 ppma carbon.

The silicon feedstock of the present invention differs substantially from a charge mix composed of various boron or phosphorus containing silicon feedstock qualities as described above in that it contains higher levels of both boron and phosphorus. It has surprisingly been found that the silicon feedstock of the present invention can be used to produce solar cells having an efficiency as good as commercial solar cells produced from electronic grade silicon.

The silicon feedstock of the present invention can be used to produce directionally solidified Czochralski, float zone or multicrystalline silicon ingots or thin silicon sheet or ribbon for making wafers for solar cells having high efficiency. Silicon ingots, thin sheets or ribbons produced from the silicon feedstock will contain between 0.2 ppma and 10 ppma boron and between 0.1 ppma and 10 ppma phosphorus, and will have a characteristic type change from p-type to n-type or from n-type to p-type at a position between 40 and 99% of the ingot height or sheet or ribbon thickness. The resisitivity profile of directionally solidified ingots produced from the feedstock of the present invention is described by a curve having a starting value between 0.4 and 10 ohm cm where the resistivity value increases towards the type change point.

According to a second aspect, the present invention relates to a directionally solidified Czochralski, float zone or multicrystalline silicon ingot or thin silicon sheet or ribbon for making wafers for solar cells, wherein the silicon ingot, thin sheet or ribbon contains between 0.2 ppma and 10 ppma boron and between 0.1 ppma and 10 ppma phosphorus said silicon ingot having a type change from p-type to n-type or from n-type to p-type at a position between 40 and 99% of the ingot height or sheet or ribbon thickness and having a resistivity profile described by a curve having a starting value between 0.4 and 10 ohm cm and where the resistivity value increases towards the type change point.

According to a preferred embodiment the silicon ingot, thin sheet or ribbon has a resistivity starting value of between 0.7 and 3 ohm cm.

According to a third aspect, the present invention relates to a method for the production of silicon feedstock for producing directionally solidified Czrochralski, float zone or multicrystalline silicon ingots, thin silicon sheets or ribbons for the production of silicon wafers for PV solar cells which method is characterized in that metallurgical grade silicon produced in an electric arc furnace by carbothermic reduction furnace and containing up to 300 ppma boron and up to 100 ppma phosphorus is subjected to the following refining steps:
a) treatment of the metallurgical grade silicon with a calcium-silicate slag to reduce the boron content of the silicon to between 0.2 ppma and 10 ppma;
b) solidifying the slag treated silicon from step a);
c) leaching the silicon from step b) in at least one leaching step by an acid leach solution to remove impurities;
d) melting the silicon from step c);
e) solidifying the molten silicon from step d) in the form of an ingot by directional solidification;
f) removing the upper part of the solidified ingot from step e) to provide a silicon ingot containing 0.2 to 10 ppma boron and 0.1 to 10 ppma phosphorus;
g) crushing and/or sizing the silicon from step f).

It has been found that the silicon feedstock produced according to this method is well suited for the production of directionally solidified ingots, thin sheets and ribbons for the production of wafers for solar cells having an efficiency comparable to commercial solar cells.

SHORT DESCRIPTION OF THE DRAWINGS

Figure 2:
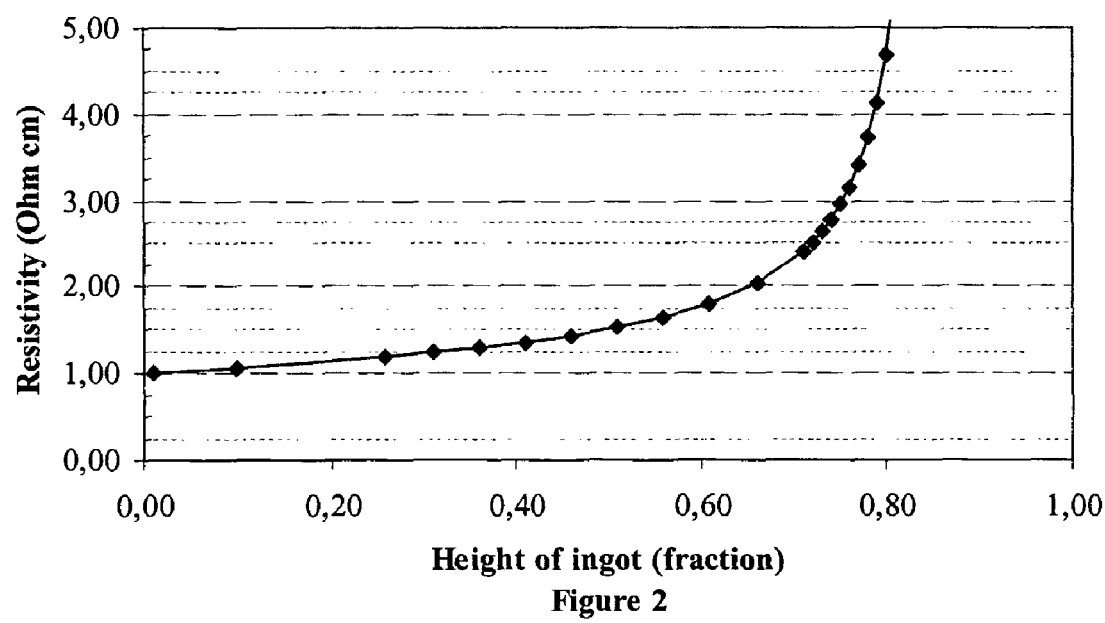

FIG. 1 is a diagram showing the resistivity as a function of ingot height for a first silicon ingot according to the invention, and, FIG. 2 is a diagram showing the resistivty as a function of ingot height for a second silicon ingot according to the invention.

DETAILED DESCRIPTION OF INVENTION

EXAMPLE 1

Production of Silicon Feedstock

Commercial metallurgical grade silicon produced by carbothermic reduction in electric arc furnace was treated with a calcium silicate slag to remove mainly boron. Boron was extracted from the molten silicon to the slag phase. The silicon was solidified with very pure silicon crystals while impurities stayed in the melt until most of the silicon was solidified. Impurities ended up on the grain boundaries in the solidified silicon.

The solidified silicon was subjected to acid leaching whereby the intergranular phases was attacked and dissolved together with the impurities. The remaining undissolved granular silicon was melted and further refined to adjust the composition before crusting an sieving to obtain the silicon feedstock for solar grade silicon.

By the method above, two charges of silicon feedstock were produced. The boron and phosphorus content of the two samples of silicon feedstock are shown in Table 1.

TABLE 1

| Sample No. | ppma boron | ppma phosphorus. |
|---|---|---|
| 1 | 3.3 | 3.2 |
| 2 | 1.2 | 1.1 |

EXAMPLE 2

Production of Directionally Solidified Silicon Ingot, Wafers and Solar Cells

Silicon feedstock produced according to the method described in Example 1 was used to produce two directionally solidified silicon ingots according to the invention. Commercial multicrystalline Si-wafers were used as reference. A Crystalox DS250 furnace was used for producing the ingot. A circular quartz crucible with an inner diameter of 25.5 cm and 20 cm height capable of containing about 12 kg of feedstock was used. The grown ingots were squared to 100 $cm^2$ and 156 $cm^2$ blocks, and then sliced into wafers by a saw. From these blocks, a large number of wafers with thickness in the range of 300-330 µm were produced for cell processing.

The content of boron and phosphorus at 20% height of the two ingots are shown in Table 2.

TABLE 2

Chemical analysis for ingot # 1 and 2 at 20% of the height.

| Ingot No. | ppma boron | ppma phosphorus |
|---|---|---|
| 1 | 2.8 | 1.3 |
| 2 | 1.0 | 0.3 |

The bulk resistivity of the as cut wafers was measured through all blocks by four-point probe on at least each fifth wafer from bottom to top. The bulk resistivity profile of ingot No 1 and 2 is shown in FIG. 1, and FIG. 2 respectively. FIGS. 1 and 2 show that the resistivity is substantially constant from the bottom of the ingot and up to about ¾ of the height of the ingot when the material changes from p-type to n-type.

The type of majority carriers in the silicon block was determined by qualitative Seebeck coefficient measurement. Hall-and resistivity measurements using van der Paw geometry were applied to obtain resistivity, carrier concentration and mobility on selected wafers from top, middle and bottom of each ingot.

All wafers were etched by NaOH for 9 minutes at 80° for saw damage removal, followed by flushing in deionized water, HCl, deionized water and 2% HF.

In order to study the effect of light trapping, isotexturisation was applied instead of NaOH etching on selected as-cut wafers. This method combines the removal of the surface saw damage on the as cut wafer and applies a surface texturisation in one step.

Solar cells were fabricated by $POCl_3$ emitter diffusion, PECVD SiN deposition, and edge isolation by plasma etching. The front and back contacts are made by screen printing and then firing through.

The efficiency of the fabricated solar cells are shown in Table 3. Efficiencies up to η=14.8% (ingot #2) were reached, which exceed the efficiency values of the reference material. Commercial monocrystalline Si wafers were used as reference for comparison.

TABLE 3

| Ingot # | Area [cm²] | Efficency best cell [%] |
|---|---|---|
| 1 | 156 | 14.3 |
| 2 | 156 | 14.8 |
| Com Ref | 156 | 14.6 |

The result from Table 3 shows that solar cells having a efficiency comparable to and even higher than commercial solar cells can be obtained by the silicon feedstock and the directionally silidified silicon ingots according to the present invention.

The invention claimed is:

1. A silicon feedstock for producing directionally solidified Czochralski, float zone or multicrystalline silicon ingots, thin sheets and ribbons for the production of silicon wafers for PV solar cells, comprising a silicon feedstock containing: between 0.3 and 5.0 ppma boron, between 0.1 and 10 ppma phosphorus, less than 150 ppma of metallic elements, and less than 100 ppma carbon distributed in the material.

2. A silicon feedstock according to claim 1 wherein the silicon feedstock contains between 0.5 and 3.5 ppma phosphorus.

3. The silicon feedstock according to claim 1 wherein the silicon feedstock comprises less than 50 ppma of metallic elements.

4. A directionally solidified Czochralski, float zone or multicrystalline silicon ingot or thin silicon sheet or ribbon for making wafers for solar cells, comprising a silicon ingot, thin sheet or ribbon containing between 0.2 ppma and 10 ppma boron and between 0.1 ppma and 10 ppma phosphorus distributed in the ingot, said silicon ingot having a type change from p-type to n-type or from n-type to p-type at a position between 40 and 99% of the ingot height or sheet or ribbon thickness and having a resistivity profile described by a curve having a starting value between 0.4 and 10 ohm cm and where the resistivity value increases towards the type change point.

5. The directionally solidified silicon ingot, thin sheet or ribbon according to claim 4, wherein resistivity starting value is between 0.7 and 3 ohm cm.

* * * * *